(12) United States Patent
Benjamin et al.

(10) Patent No.: US 7,274,004 B2
(45) Date of Patent: Sep. 25, 2007

(54) METHOD AND APPARATUS FOR CONTROLLING THE SPATIAL TEMPERATURE DISTRIBUTION ACROSS THE SURFACE OF A WORKPIECE SUPPORT

(75) Inventors: Neil Benjamin, East Palo Alto, CA (US); Robert Steger, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/001,218

(22) Filed: Nov. 30, 2004

(65) Prior Publication Data

US 2005/0173403 A1 Aug. 11, 2005

Related U.S. Application Data

(60) Division of application No. 10/062,395, filed on Feb. 1, 2002, now Pat. No. 6,847,014, which is a continuation-in-part of application No. 09/846,432, filed on Apr. 30, 2001, now abandoned.

(51) Int. Cl.
*H05B 3/68* (2006.01)
*C23C 16/00* (2006.01)

(52) U.S. Cl. .................... 219/444.1; 118/724

(58) Field of Classification Search ........... 219/443.1, 219/444.1, 390; 118/724, 725; 427/240; 156/345.51, 345.52, 345.53
See application file for complete search history.

(56) References Cited

U.S. PATENT DOCUMENTS

| | | | |
|---|---|---|---|
| 4,361,749 A | * | 11/1982 | Lord .................. 219/121.4 |
| 4,518,848 A | | 5/1985 | Weber |
| 5,059,770 A | | 10/1991 | Mahawill |
| 5,192,849 A | | 3/1993 | Moslehi et al. |
| 5,290,381 A | | 3/1994 | Nozawa et al. |
| 5,294,778 A | | 3/1994 | Carman et al. |
| 5,401,316 A | | 3/1995 | Shiraishi et al. |
| 5,413,360 A | | 5/1995 | Atari et al. |
| 5,460,684 A | | 10/1995 | Saeki et al. .................. 156/345 |

(Continued)

FOREIGN PATENT DOCUMENTS

WO    WO 02/089531    7/2002

(Continued)

OTHER PUBLICATIONS

International Search Report, PCT/US2005/043801, mailed Feb. 6, 2006.

(Continued)

*Primary Examiner*—Sang Paik
(74) *Attorney, Agent, or Firm*—Thelen Reid Brown Raysman & Steiner LLP

(57) ABSTRACT

A chuck for a plasma processor comprises a temperature-controlled base, a thermal insulator, a flat support, and a heater. The temperature-controlled base has a temperature below the desired temperature of a workpiece. The thermal insulator is disposed over the temperature-controlled base. The flat-support holds a workpiece and is disposed over the thermal insulator. A heater is embedded within the flat support and/or disposed on an underside of the flat support. The heater includes a plurality of heating elements that heat a plurality of corresponding heating zones. The power supplied and/or temperature of each heating element is controlled independently.

8 Claims, 4 Drawing Sheets

U.S. PATENT DOCUMENTS

| | | |
|---|---|---|
| 5,529,657 A | 6/1996 | Ishii .................... 156/345 |
| 5,539,179 A | 7/1996 | Nozawa et al. |
| 5,580,607 A * | 12/1996 | Takekuma et al. .......... 427/240 |
| 5,616,024 A * | 4/1997 | Nobori et al. ............... 432/241 |
| 5,802,856 A * | 9/1998 | Schaper et al. ............... 62/3.7 |
| 5,846,375 A * | 12/1998 | Gilchrist et al. ........ 156/345.52 |
| 5,851,641 A | 12/1998 | Matsunaga et al. |
| 5,854,468 A | 12/1998 | Muka |
| 5,925,227 A | 7/1999 | Kobayashi et al. |
| 6,048,434 A * | 4/2000 | Tamura et al. ......... 156/345.52 |
| 6,051,303 A | 4/2000 | Katsuda et al. |
| 6,080,970 A | 6/2000 | Yoshida et al. |
| 6,084,215 A | 7/2000 | Furuya et al. |
| 6,259,592 B1 | 7/2001 | Ono |
| 6,310,755 B1 | 10/2001 | Kholodenko et al. |
| 6,365,879 B1 | 4/2002 | Kuibira et al. |
| 6,379,222 B2 | 4/2002 | Wise et al. |
| 6,472,643 B1 | 10/2002 | Babikian ................. 219/444.1 |
| 2002/0020358 A1 | 2/2002 | Hey et al. |

FOREIGN PATENT DOCUMENTS

| | | |
|---|---|---|
| WO | WO2004/077505 A | 9/2004 |

OTHER PUBLICATIONS

Supplementary European Search Report, EP 02 72 3949, mailed Jan. 5, 2006.

* cited by examiner

METHOD AND APPARATUS FOR CONTROLLING THE SPATIAL TEMPERATURE DISTRIBUTION ACROSS THE SURFACE OF A WORKPIECE SUPPORT

CROSS-REFERENCES

This is a divisional application of U.S. patent application Ser. No. 10/062,395, filed Feb. 1, 2002 now U.S. Pat. No. 6,847,014 which is a continuation-in-part of U.S. patent application Ser. No. 09/846,432, filed Apr. 30, 2001 now abandoned, in the name of inventors Neil Benjamin and Robert Steger, entitled "Method and Apparatus for controlling the spatial temperature distribution across the surface of a workpiece support", commonly assigned herewith.

FIELD OF THE INVENTION

The present invention relates to substrate supports. More particularly, the present invention relates to a method and apparatus for achieving uniform temperature distribution within a substrate during plasma processing.

BACKGROUND OF THE INVENTION

A typical plasma etching apparatus comprises a reactor in which there is a chamber through which reactive gas or gases flow. Within the chamber, the gases are ionized into a plasma, typically by radio frequency energy. The highly reactive ions of the plasma gas are able to react with material, such as a polymer mask on a surface of a semiconductor wafer being processed into integrated circuits (IC's). Prior to etching, the wafer is placed in the chamber and held in proper position by a chuck or holder which exposes a top surface of the wafer to the plasma gas. There are several types of chucks (also sometimes called susceptors) known in the art. The chuck provides an isothermal surface and serves as a heat sink for the wafer. In one type, a semiconductor wafer is held in place for etching by mechanical clamping means. In another type of chuck, a semiconductor wafer is held in place by electrostatic force generated by an electric field between the chuck and wafer. The present invention is applicable to both types of chucks.

In a typical plasma etching operation, the reactive ions of the plasma gas chemically react with portions of material on a face of the semiconductor wafer. Some processes cause some degree of heating of the wafer, but most of the heating is caused by the plasma. The chemical reaction between gas (ions and radicals) and wafer material, on the other hand, is accelerated to some degree by the temperature rise of the wafer. Local wafer temperature and rate of chemical reaction at each microscopic point on the wafer are related to an extent that harmful unevenness in etching of material over a face of the wafer can easily result if the temperature of the wafer across its area varies too much. In most cases, it is highly desirable that etching be uniform to a nearly perfect degree since otherwise the Integrated circuit Devices (ICs) being fabricated will have electronic characteristics that deviate from the norm more than is desirable. Furthermore, with each increase in the size of wafer diameter, the problem of ensuring uniformity of each batch of ICs from larger and larger wafers becomes more difficult. In some other cases, it would be desirable to be able to control the surface temperature of the wafer to obtain a custom profile.

The problem of temperature rise of a wafer during reactive ion etching (RIE) is well known, and various attempts in the past to control the temperature of a wafer during etching have been tried. FIG. 1 illustrates one way to control wafer temperature during RIE. A coolant gas (such as helium) is admitted at a single pressure within a single thin space 102 between the bottom of the wafer 104 and the top of the chuck 106 which holds the wafer 104.

There is generally no o-ring or other edge seal at the chuck perimeter except for a smooth sealing land extending from 1 to 5 mm at the outer edge of the chuck 106 in order to reduce coolant leakage. Inevitably, without any elastomer seal there is significant and progressive pressure loss across the sealing land, such that the edge of the wafer 104 is inadequately cooled. The heat impinging near the edge of the wafer 104 must therefore flow significantly radially inward before it can effectively be conducted away to the chuck. The arrows 106 top of the wafer 104 illustrate the incoming flux heating the wafer 104. The flow of the heat in the wafer 104 is illustrated with the arrows 110. This explains why the edge zone of the chuck always tends to be hotter than the rest of the surface. FIG. 2 illustrates a typical temperature distribution on the wafer 104. The pressure loss at the peripheral portions of the wafer 104 causes the wafer 104 to be much hotter at the peripheral portions.

One way of dealing with the need for zone cooling is to vary the surface roughness or to cut a relief pattern to effectively change the local contact area. Such a scheme can be used without backside coolant gas at all, in which case the contact area, surface roughness, and clamp force determine the heat transfer. However the local contact area can only be adjusted by re-machining the chuck. Another way of dealing with the need for zone cooling is to use coolant gas whose pressure is varied to increase and fine tune thermal transport. However the relief pattern is still substantially fixed. By dividing the surface of the chuck into different zones, with or without small sealing lands as dividers, and supplying separate cooling gasses to each zone, a greater degree of independent spatial control may be achieved. The gas supply to each zone may have different composition or be set to a different pressure, thus varying the thermal conduction. Each zone's operating conditions may be set under recipe control, or even dynamically stabilized during each process step. Such schemes depend on redistributing the incoming heat flux from the plasma and extracting it into different regions. This is relatively effective at high power flux but will only give small temperature differentials at lower power flux. For instance, with about 1 W per $cm^2$ of uniform flux and about 3 mm sealing land, it is possible to get center to edge thermal gradients that lead to a 10° C. to 30° C. temperature increase near the wafer periphery. Thermal gradients of this magnitude can be very effective as a process control parameter. However, other processes may run at low power, for instance poly gate processes, may have a flux of only 0.2 W per $cm^2$. Unless the average conduction is made extremely low, which is very difficult to control and tends to result in inadequate overall cooling, then there will be only a very small differential of typically less than 5° C.

Accordingly, a need exists for a method and apparatus for controlling the temperature of semiconductor wafers during reactive ion etching and similar processes without requiring significant plasma heat flux. A primary purpose of the present invention is to solve these needs and provide further, related advantages.

BRIEF DESCRIPTION OF THE INVENTION

A chuck for a plasma processor comprises a temperature-controlled base, a thermal insulator, a flat support, and a heater. The temperature-controlled base has a temperature below the desired temperature of a workpiece. The thermal insulator is disposed over the temperature-controlled base. The flat support holds a workpiece and is disposed over the thermal insulator. A heater is embedded within the flat support and/or disposed on an underside of the flat support. The heater includes a plurality of heating elements that heat a plurality of corresponding heating zones. The power supplied and/or temperature of each heating element is controlled independently.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a method and apparatus for controlling the spatial temperature distribution across the surface of a workpiece support. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
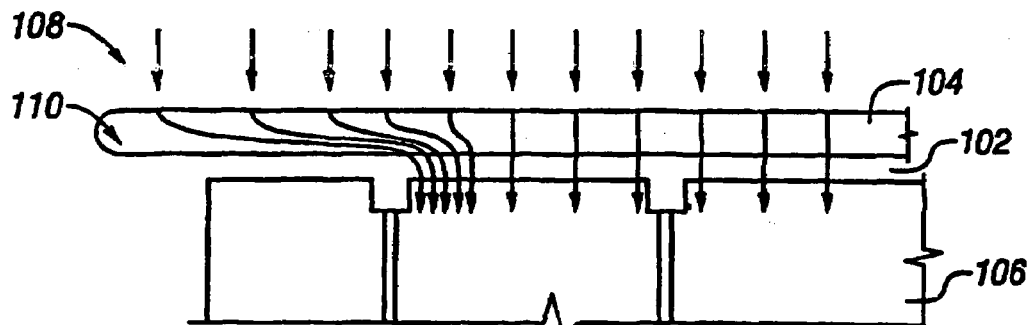
FIG. 1 is a schematic elevational diagram of a support holding a wafer under process in accordance with the prior art.
Figure 2:
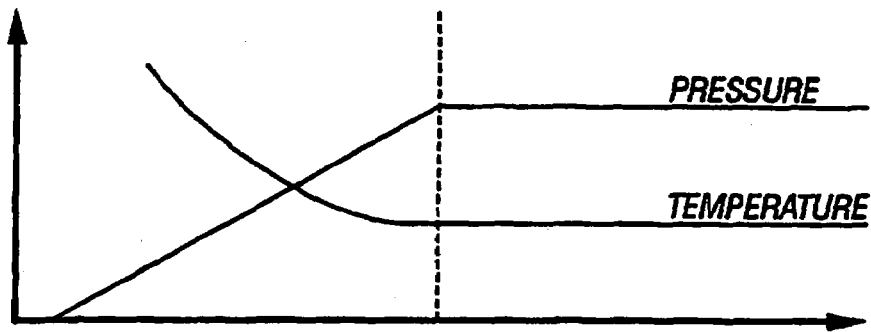
FIG. 2 is a plot illustrating the temperature of a wafer and the pressure of a coolant in the apparatus of FIG. 1 in accordance with the prior art.
Figure 3A:
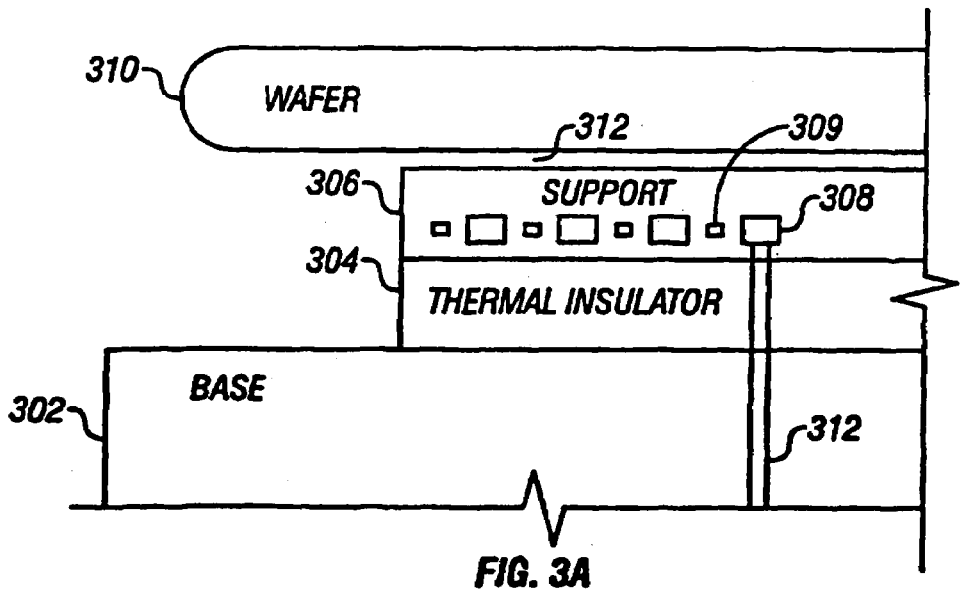
FIG. 3A is a schematic elevational diagram illustrating an apparatus for controlling the temperature of a workpiece in accordance with one embodiment of the present invention.

The apparatus of the present invention seeks to achieve precise significant thermal differential control, for example over 5° C., but without requiring significant plasma heat flux, for example less than 2 W per cm$^2$. FIG. 3A is a schematic elevational diagram illustrating an apparatus for controlling the temperature of a workpiece in accordance with one embodiment of the present invention. A base 302 or a heat exchanger supports a thermal insulator 304. A support 306, preferably flat, is mounted over the thermal insulator 304. A heater 308 is embedded in the support 306. A workpiece 310, such as a wafer, is disposed over the support 306. A thermal conductor 312 provides an intimate thermal contact between the support 306 and the workpiece 310. The thermal conductor 312 may be preferably a gas, such as helium. The helium pressure controls the thermal conduction between the workpiece 310 and the support 306.

According to one embodiment, the base 302 comprises a metallic material, preferably an aluminum base cold plate, that is maintained at a relatively constant temperature through a conventional heat exchange system such as a cooling/heating fluid loop. According to another embodiment, the base 302 may also comprise a non-metallic material, such as aluminum nitrate. However, the base 302 must be chilled to a greater extent than in standard operation without the heater 308. For example, the temperature of the base 302 may be 10° C. to 50° C. below the desired temperature of the workpiece 310. The base 302 also provides a thermal sink for plasma heating. An external coolant chiller (not shown) may be used to maintain the temperature of the baseplate. Preferably, the amount of heat removed by the external coolant chiller and the temperature of the coolant may be limited to less than 2000 W and −20° C., respectively. The base 302 further have several holes or cavities (not shown) through which heater power lines 312 or other service lines are disposed. Such service lines may comprise power lines for the heater, sensors, high voltage electrostatic clamping. Those of ordinary skills in the art will recognize that the service lines are not limited to the ones previously cited.

According to one embodiment, the thermal insulator 304 acts as significant thermal impedance break between the support 306 and the base 302. The thermal insulator 304 may comprise a thick RTV bonding adhesive layer made of polymer, plastic, or ceramic. However, the thermal impedance break of the thermal insulator 304 cannot be too excessive otherwise the wafer 310 will be insufficiently cooled. For example, the thermal insulator preferably has a thermal conductivity of a range of about 0.05 W/mK to about 0.20 W/mK. The thermal insulator 304 in this case both acts as a thermal resistive element and a bond between the support 306 and the base 302. Furthermore, the thermal insulator 304 must be such that adequate RF coupling between the plasma and the base 302 is maintained. Also, the thermal insulator 304 must tolerate significant thermal-mechanical shear due to different materials and temperatures located above and below the layer. Preferably, the thickness of the thermal insulator 304 should be less than 2 mm. Thermal insulator 304 may further incorporate several cavities or vias (not shown) contiguous to the cavities of the base 302 for housing parts of the heater power lines 314 and other service lines.

According to one embodiment, the support 306 comprises a ceramic material. The ceramic may be a non-electrically conductive material, such as for example alumina. The shape of the support 306 may preferably include a conventional disk commonly used in plasma etching systems. The support 306 may be a conventional electrostatic chuck or may be a ceramic having a mechanical clamp for holding down the wafer 310. According to one embodiment, the thickness of the support 306 is about 2 mm. However, one of skills in the art will recognize that other thicknesses may also be suitable. According to another embodiment, the support 306 construction is of a "thin disk bonded to a base" type, otherwise the lateral conduction may be so high that the heater input will be spread laterally resulting in an ineffective zone separation. The support should allow the heat to dissipate locally.

The heater 308 comprises at least one resistive element. According to one embodiment, the heater 308 may be embedded in the support 306 below the clamp electrode plane and be shaped in any desirable pattern, for example, symmetrical or arbitrary. The heater 308 may also have one or more planar heating elements. Each heating element defines a heating zone or region that may be controlled independently. The multi-zone pattern has one or more planar heating elements acting in opposition to the conduction cooling to the support 306. A sensor 309 associated with each heating zone may measure the temperature for each heating zone and send a signal to a controller or computer system (see FIG. 7) to monitor and control each individual planar heating element. For example, a sensor such as an infrared emission sensor or thermo-couple sensor can be mounted either through ports to read directly from the workpiece 310. The sensors 309 can also be mounted within or to the back of the support 306. The heater 308 may be powered by power lines 312 disposed through openings in the thermal insulator 304 and the base 302.

According to one embodiment, heater 308 comprises an inductive heater. According to another embodiment, heater 308 comprises a heating lamp, such as krypton or quartz lamp. According to yet another embodiment, heater 308 comprises thermoelectric modules that can cool or heat. With thermoelectric modules, a base and a thermal break may be optional. One of ordinary skills in the art will recognize that many other ways exists to heat support 306.

Figure 3B:
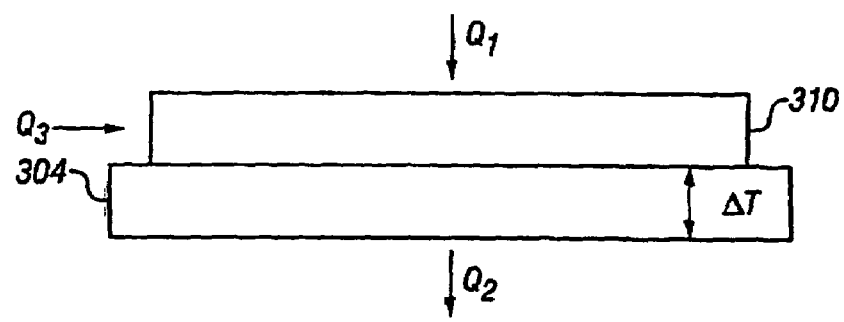
FIG. 3B illustrates a simplified schematic of thermal flow dynamic in the apparatus of FIG. 3A.

FIG. 3B illustrates a simplified schematic of thermal flow dynamic in the apparatus of FIG. 3A. The incoming plasma heat flux Q1 contributes to the temperature T1 on the surface of the wafer 310. The heater 308 provides additional heat Q3 to the wafer 310. The flux Q2 exiting the system through the workpiece support 306 to the cooled base 302 is approximately equal to both incoming flux Q1 and Q3. Therefore:

$$Q1+Q3 \approx Q2$$

By definition, the sum of the temperature T1 of the wafer 310 and the temperature ΔT through the thermal insulator 304 is equal to the temperature T1 of the cooled base 302:

$$T1 = T2 + \Delta T$$

It should be noted that ΔT is defined by the thermal conductivity of the thermal insulator 304. The incoming flux Q3, which is produced by the heater 308, thus controls ΔT. Therefore, the power of the heater 308 can be adjusted to produce a desired temperature T1 on the surface of the wafer for a range of Q1.

Preferably, the temperature of the base 302 is set to produce an exiting flux Q2 of approximately half of the maximum incoming flux of Q3 when there are no incoming flux Q1 and the maximum flux of Q3 is approximately equal to the maximum flux of Q1:

$$Q2 \approx \tfrac{1}{2} Q3_{max}$$

when $Q1=0$ and $Q3_{max} \approx Q1_{max}$

In this preferred scheme, the range over which T1 can be varied is maximized. That is, the local temperature of the wafer can be adjusted by controlling the heating power of a zone of the heater 308. According to one embodiment, the temperature of the base 302, i.e. the coolant temperature, is set about 20° C. cooler than a conventional apparatus in which the sum of the maximum value of Q1 and the maximum value of Q3 is equal to the maximum value of Q2.

Figure 4A:
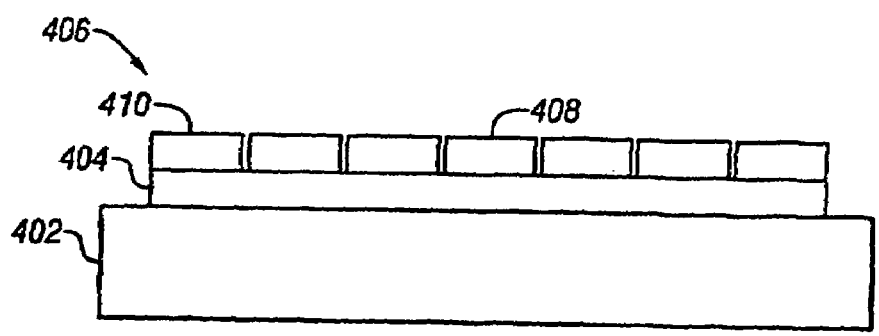
FIG. 4A is a schematic elevational diagram illustrating an apparatus with a combined single planar layer electrode and heater for controlling the temperature of a workpiece in accordance with another embodiment of the present invention.
Figure 4B:
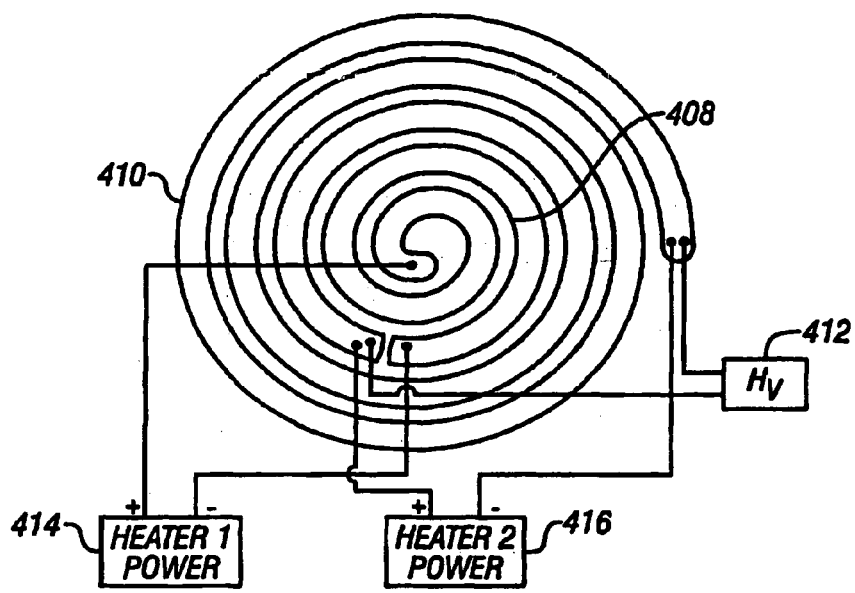
FIG. 4B is a schematic top view illustrating an apparatus with a combined single planar layer electrode and heater for controlling the temperature of a workpiece in accordance with another embodiment of the present invention.

Turning now to FIG. 4A, a schematic elevational diagram illustrating an apparatus with a combined single planar layer electrode and heater for controlling the temperature of a workpiece in accordance with another embodiment of the present invention is shown. A base 402 supports a thermal insulator 404. A flat support 406 is mounted on the thermal insulator 404. According to one embodiment, the flat support 406 comprises an inner spiral 408 and an outer spiral 410 both used as a heater for heating a workpiece and an electrode for clamping the workpiece. Both heater and electrode are combined to form a single layer planar structure represented by flat support 406. FIG. 4B illustrates a top view of the flat support 406. The differential high voltage HV 412 is applied to between the inner and outer spirals 408 and 410 to generate the electrostatic clamping function of the flat support 406. If the differential high voltage HV 412 is applied to both inner and outer spirals 408 and 410 with respect to the ground, the flat support 406 may act as a mono-polar electrostatic chuck. If the differential high voltage HV 412 is applied in between the inner and outer spirals 408 and 410, the flat support 406 may act as a bipolar chuck. A first controlled electrical power source 414 is coupled to the inner coil 408 for generating a first heating zone. A second controlled electrical power source 416 is coupled to the outer coil 410 for generating a second heating zone.

Figure 5:
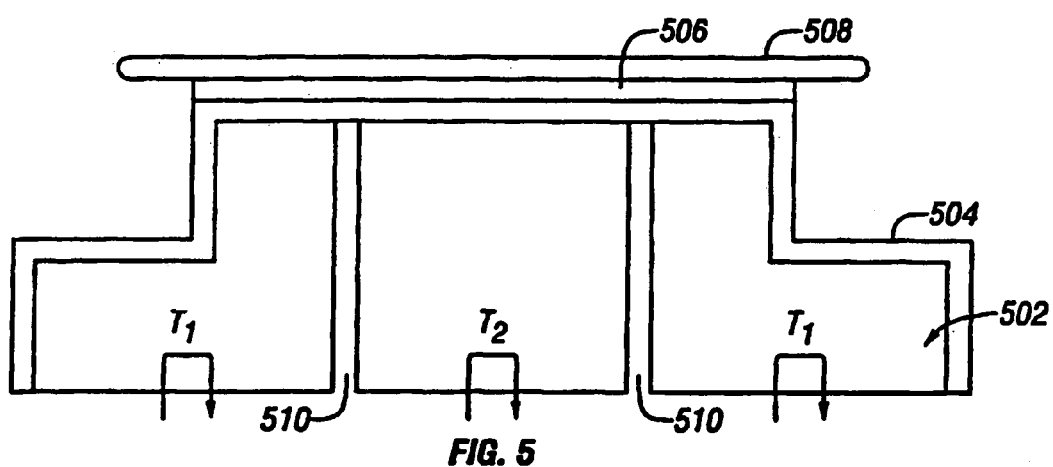
FIG. 5 is a schematic elevational diagram illustrating an apparatus for controlling the temperature of a workpiece using a lateral thermal break approach in accordance with another alternative embodiment of the present invention.

FIG. 5 is a schematic elevational diagram illustrating an apparatus for controlling the temperature of a workpiece using a lateral thermal break approach in accordance with another alternative embodiment of the present invention. A dual or multiple manifold heat sink may be used to circulate a temperature controlled fluid instead of using direct electrical heating or coolant at different temperature. A temperature controlled base 502 supports a thermal insulator 504, for example, ceramic. A flat support 506 provides support to a workpiece 508. Thermal insulators 510 azimuthally separate the base 502 into two or More zones, each zone representing a heat sink. The arrows represent the different heat sink zones. In particular, the lateral thermal breaks 510 separate the heat sink into two or more thermal zones, for example, T1 and T2. The temperature of each thermal zone may be controlled independently by controlling the fluid temperature in each fluid loop. The use of such thermal break 510 allows for arbitrary spatial zones.

Figure 6:
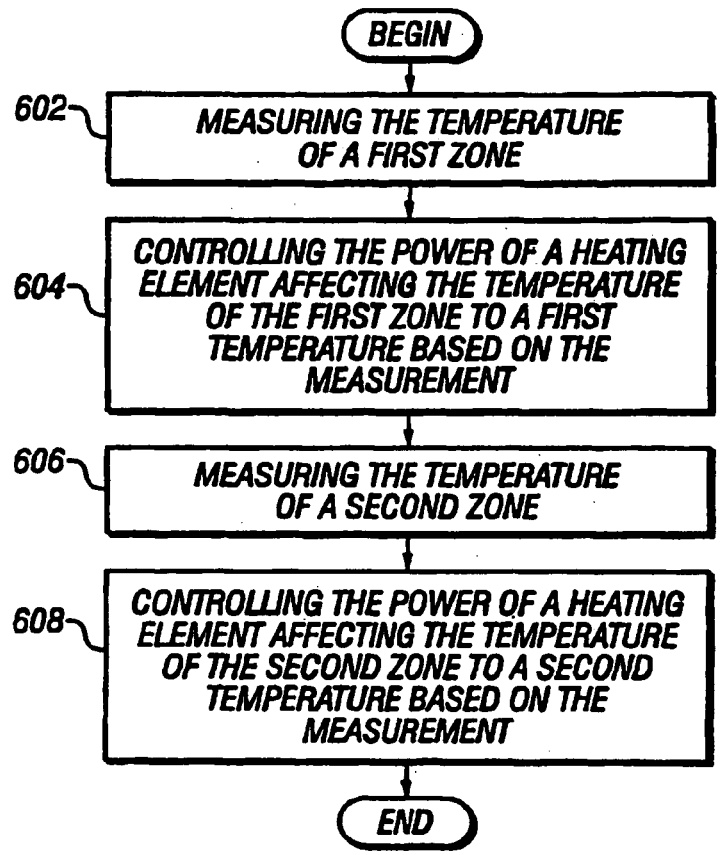
FIG. 6 is a flow diagram illustrating a method for controlling the temperature of a chuck in accordance with one embodiment of the present invention.

FIG. 6 is a flow diagram illustrating a method for controlling the temperature of a chuck in accordance with one embodiment of the present invention. In particular, FIG. 6 illustrates a method for controlling the temperature of a chuck having two distinct thermal zones. Those of ordinary skills in the art will recognize that the method may be applied to a chuck having one or more thermal zones. In a first block 602, the temperature of a first zone is measured with a first set of sensors. Based on these measurements, the power of a heating element affecting the temperature of the first zone is controlled to adjust the temperature of the first zone to a temperature set by a user and/or a computer in block 604. In a second block 606, the temperature of a second zone is measured with a second set of sensors. Based on these measurements, the power of a heating element affecting the temperature of the second zone is controlled to adjust the temperature of the second zone to a temperature set by a user and/or a computer in block 608.

Figure 7:
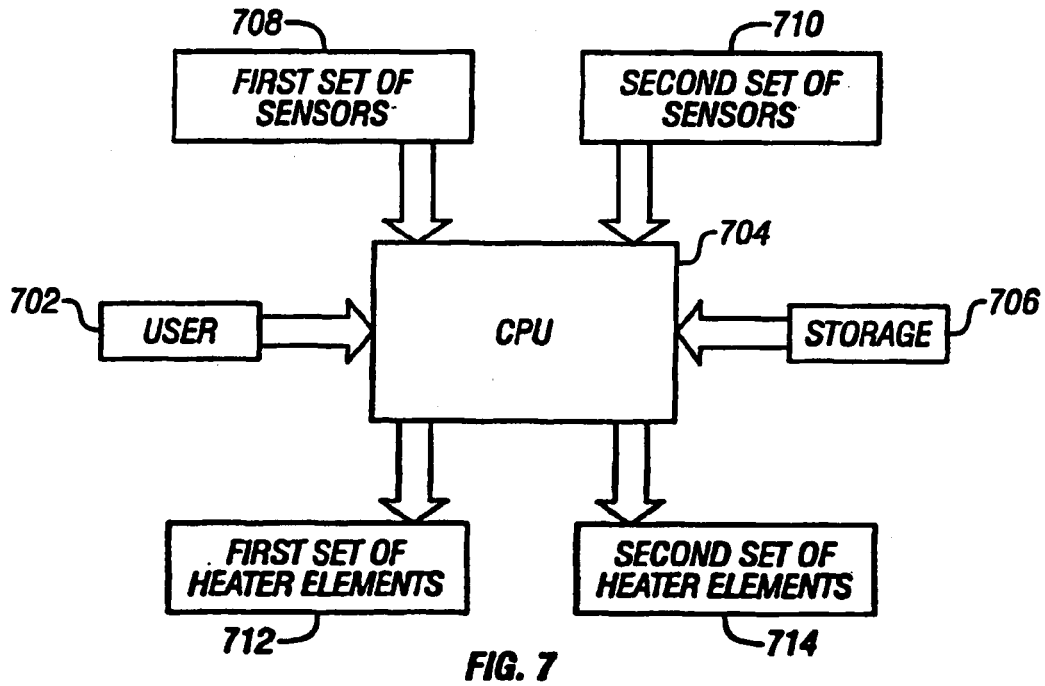
FIG. 7 is a schematic diagram of a system for controlling the temperature of a chuck in accordance with one embodiment of the present invention.

FIG. 7 is a schematic diagram of a system for controlling the temperature of a chuck in accordance with one embodiment of the present invention. A user 702 may define a set of parameters to a computer 704. Such set of parameters may be, for example, the desired temperature of a first zone on the chuck, the desired temperature of a second zone on the chuck. Those of ordinary skills in the art will recognize that the chuck may have one or more zones. The computer 704 communicates with a storage component 706 storing the algorithm of FIG. 6, inputs and outputs of computer 704. A first set of sensors 708 measures the first zone on the chuck. A second set of sensors 710 measures the second zone on the chuck. Based on the temperature measurement of the first set of sensors 708, computer 704 sends controls to the first set of heating elements 712 to adjust the temperature of the first zone on the chuck. Based on the temperature measurement of the second set of sensors 710, computer 704 sends controls to the second set of heating elements 714 to adjust the temperature of the second zone on the chuck.

These generalized methods for controlling the temperature profile of a wafer on an electrostatic chuck are not only suited to application in a Inductive Coupled Plasma (ICP) processing machine, but also in any other system application, especially one that requires a low plasma power flux to the wafer. This technique may be applied to any other applications where a need to produce thermal grading exists.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A chuck assembly for a plasma processor, the chuck assembly comprising:
    a support element for supporting a workpiece; and
    a single-piece base element disposed below the support element and thermally coupled thereto, the base element having a continuous layer of thermal insulator disposed upon a surface thereof, the base element thermally separated by at least one lateral thermal break into at least two temperature controlled portions, wherein one portion is disk-shaped, and a peripheral portion extends beyond the support element, each portion independently thermally controllable by circulating a temperature controlled fluid through a fluid loop associated with each portion.

2. The chuck assembly of claim 1, further comprising a thermally conductive medium disposed over the support element.

3. The chuck assembly of claim 1, wherein the wafer support element further comprises a first temperature sensor disposed above a first portion of the base element and a second temperature sensor disposed above a second portion of the base element.

4. The chuck assembly of claim 3, further comprising a controller responsive to said first and second temperature sensors and configured to control temperature in the first and second portions of the base element.

5. The chuck assembly of claim 1 wherein the lateral thermal break comprises a thermally insulating material.

6. The chuck assembly of claim 1 wherein the independently thermally controllable portions control the temperature of the support element.

7. The chuck assembly of claim 1 wherein the insulator has a thermal conductivity range of 0.05 W/mK to 0.20 W/mK.

8. A method comprising:
    determining a fluid temperature corresponding to each of two or more portions of a single-piece base element of a chuck assembly, the base element having a continuous layer of thermal insulator disposed upon a surface thereof, the base element thermally separated by at least one lateral thermal break into at least two temperature controlled portions, wherein one portion is disk-shaped, and a peripheral portion extends beyond the support element, each portion independently thermally controllable by circulating a temperature controlled fluid through a fluid loop associated with each portion;
    circulating a fluid of the determined fluid temperature through a fluid loop associated with each of the corresponding portions to control the temperature of a workpiece disposed upon a support element of the chuck assembly, the support element disposed above the base element and thermally coupled thereto.

* * * * *